United States Patent
Sakano et al.

(10) Patent No.: US 11,874,481 B2
(45) Date of Patent: Jan. 16, 2024

(54) HEAD-MOUNTED DISPLAY

(71) Applicant: Tomoegawa Co., Ltd., Tokyo (JP)

(72) Inventors: Tsubasa Sakano, Shizuoka (JP); Masahide Sugiyama, Shizuoka (JP)

(73) Assignee: TOMOEGAWA CO., LTD., Tokyo (JP)

(*) Notice: Subject to any disclaimer, the term of this patent is extended or adjusted under 35 U.S.C. 154(b) by 632 days.

(21) Appl. No.: 17/054,768

(22) PCT Filed: Mar. 22, 2019

(86) PCT No.: PCT/JP2019/012068
§ 371 (c)(1),
(2) Date: Nov. 11, 2020

(87) PCT Pub. No.: WO2019/220775
PCT Pub. Date: Nov. 21, 2019

(65) Prior Publication Data
US 2021/0263200 A1 Aug. 26, 2021

(30) Foreign Application Priority Data
May 14, 2018 (JP) .................................. 2018-093205

(51) Int. Cl.
*H01L 29/08* (2006.01)
*G02B 5/02* (2006.01)
(Continued)

(52) U.S. Cl.
CPC ......... *G02B 5/0257* (2013.01); *G02B 5/0221* (2013.01); *H10K 50/854* (2023.02); *H10K 59/35* (2023.02); *H10K 59/38* (2023.02)

(58) Field of Classification Search
CPC .. G02B 5/0257; G02B 5/0221; H10K 50/854; H10K 59/35; H10K 59/38;
(Continued)

(56) References Cited

U.S. PATENT DOCUMENTS

| 2014/0293189 A1 | 10/2014 | Fukunaga |
| 2017/0003422 A1* | 1/2017 | Sugiyama ............ G02B 5/0278 |
| 2018/0061894 A1 | 3/2018 | Kim |

FOREIGN PATENT DOCUMENTS

| JP | 07-043634 A | 2/1995 |
| JP | 2013-167814 A | 8/2013 |

(Continued)

OTHER PUBLICATIONS

English Translation of the International Preliminary Report on Patentability for the WIPO Application No. PCT/JP2019/012068 dated Nov. 26, 2020.

*Primary Examiner* — Niki H Nguyen
(74) *Attorney, Agent, or Firm* — Muncy, Geissler, Olds & Lowe, P.C.

(57) ABSTRACT

To provide a head-mounted display that can obtain a higher sense of immersion without sensing coloring by diffusing and transmitting light from an organic electroluminescence display panel by an anisotropic optical film to reduce the visibility of a black matrix (BM). The head-mounted display is provided with an anisotropic optical film on the viewing side with respect to a color filter or an RGB light emitting layer in an organic electroluminescence display panel, said anisotropic optical film having a linear transmittance that varies depending on an incident light angle. The head-mounted display is characterized in that: the anisotropic optical film includes at least a single or a plurality of anisotropic light diffusion layers; and the anisotropic light diffusion layers have a matrix region and a plurality of pillar regions having refractive indexes different from that of the matrix region.

12 Claims, 9 Drawing Sheets

(51) Int. Cl.
*H10K 50/854* (2023.01)
*H10K 59/35* (2023.01)
*H10K 59/38* (2023.01)

(58) Field of Classification Search
CPC ............ H01L 27/1225; H01L 29/7869; H01L 27/1214; H01L 29/66969; H01L 29/66742; H01L 21/02565; H01L 27/1251; H01L 29/42384; H01L 29/41733; H01L 29/78609; H01L 27/0266; H01L 27/1222; H01L 21/02664; H01L 21/324; H01L 29/78645; H01L 27/0883; H01L 21/02595; H01L 27/14636; H01L 27/14612; H01L 27/14627; H01L 21/465; H01L 29/517; H01L 29/7809; H01L 29/7813; H01L 29/518; H01L 27/1285; H01L 21/02573; H01L 27/14623; H01L 21/28008; H01L 27/14687; H01L 33/007; H01L 33/20; H01L 21/02225; H01L 21/2636; H01L 27/14685; H01L 29/41725
See application file for complete search history.

(56) References Cited

FOREIGN PATENT DOCUMENTS

| | | |
|---|---|---|
| JP | 2014191228 A | 10/2014 |
| JP | 2016206512 A | 12/2016 |
| JP | 2018036618 A | 3/2018 |
| JP | 2018-059965 A | 4/2018 |
| WO | 02/097483 A1 | 12/2002 |
| WO | 2008053592 A1 | 5/2008 |
| WO | 2017047271 A1 | 3/2017 |
| WO | 2018159470 A1 | 9/2018 |

* cited by examiner

FIG. 2
(a)
(b)
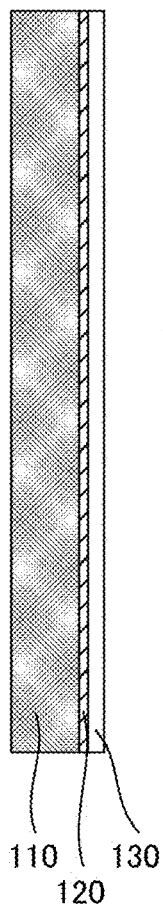
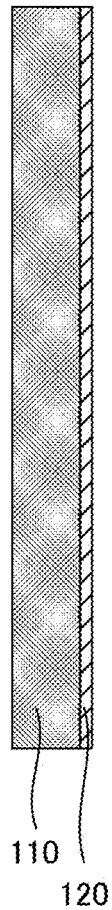

FIG. 4
(a)
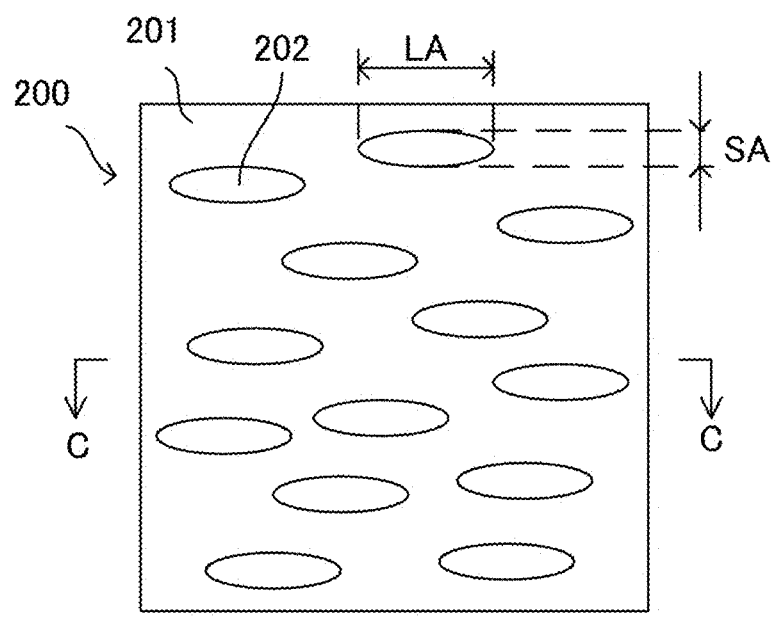
(b)
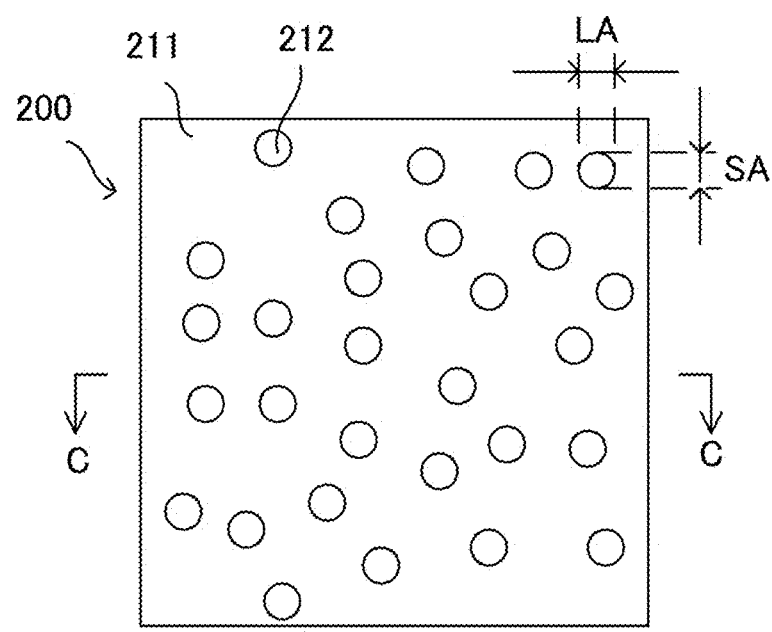

FIG. 9
(a)
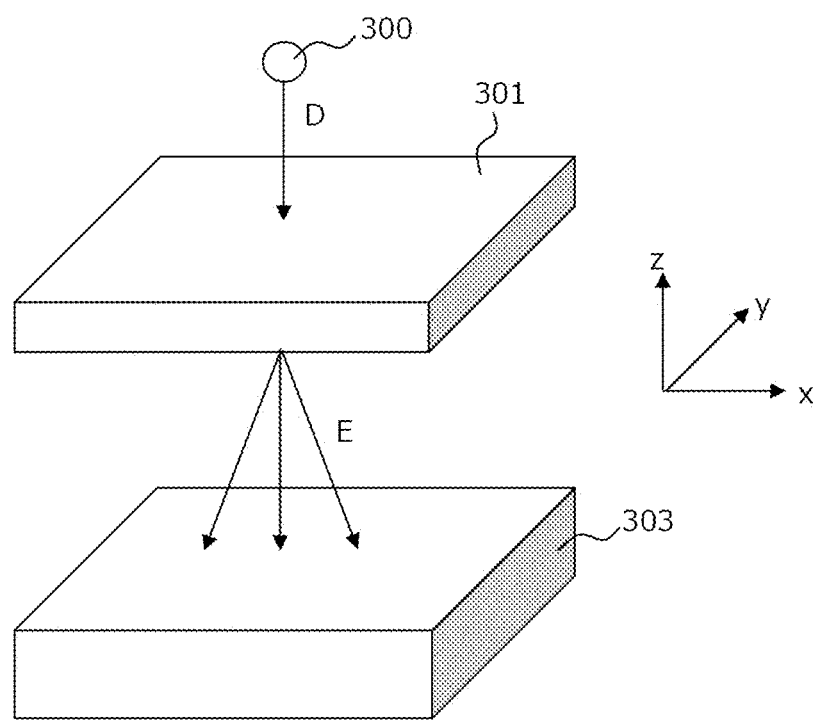
(b)
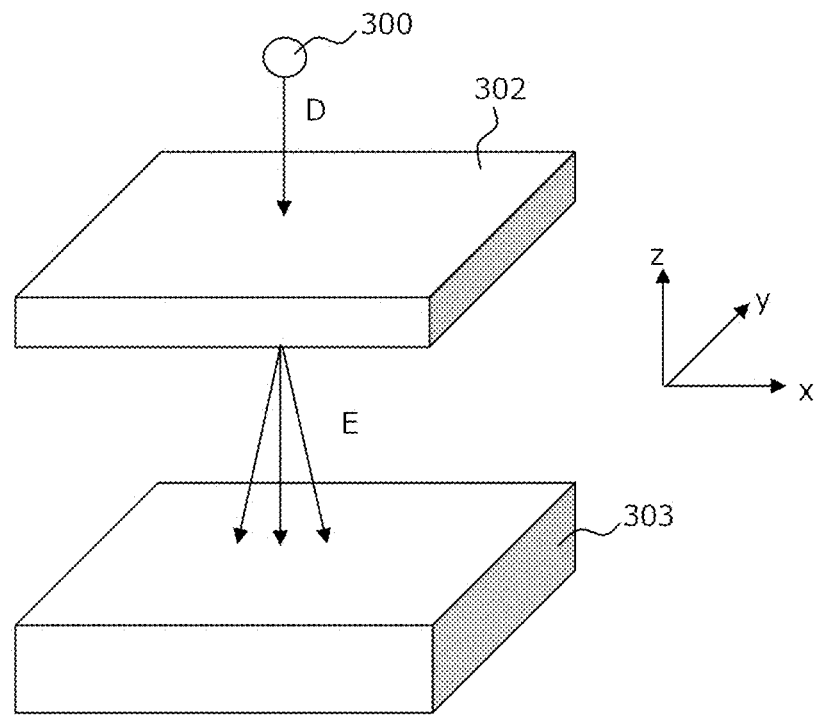

HEAD-MOUNTED DISPLAY

TECHNICAL FIELD

The present invention relates to a head-mounted display.

BACKGROUND ART

In recent years, virtual reality (hereinafter abbreviated as VR) technical development has proceeded, and a head-mounted display (hereinafter abbreviated as HMD) has been used as a display device. The HMD is a display device which includes a liquid crystal (hereinafter abbreviated as LCD) display panel and an organic electroluminescence (hereinafter abbreviated as OLED) display panel and the like, and directly provides an image to viewer's eyes using a compact image display panel.

Unlike conventional liquid crystal display panels and the like, the HMD has a close distance between the eyes and the image display panel, whereby a sense of immersion necessary for VR can be obtained.

The OLED includes a method using a color filter in only a white light emitting layer and a method using red (R), green (G), and blue (B) light emitting layers (hereinafter abbreviated as an RGB light emitting layer). Among them, in the method using the color filter, a black matrix (BM) is formed between pixels of the color filter in order to prevent the light leakage from the light emitting layer and the color mixture of RGB (FIG. 1). Furthermore, in the method using the RGB light emitting layer, gaps due to pixels similar to the black matrix are present. In the present invention, hereinafter, the black matrix in the method using the color filter and the pixel gap in the method using the RGB light emitting layer will be collectively referred to as the black matrix (BM).

Due to the black matrix, the eyes and the display panel of the head-mounted display are in close proximity to each other, which causes a problem that the black matrix is more remarkably visible (screen door effect). This may impair the sense of immersion necessary for VR.

With respect to this problem, Patent Literature 1 proposes that a predetermined phase type diffraction grating is provided on the panel surface (viewing) side of a liquid crystal display panel.

CITATION LIST

Patent Literature

Patent Literature 1: JP 2016-206512 A

SUMMARY OF INVENTION

Technical Problem

However, in the HMD using the phase type diffraction grating disclosed in Patent Literature 1, the roughness of an image is clarified to be suppressed, but the black matrix is merely observed to be thin, so that a sufficient sense of immersion may not be obtained.

The present invention has been made in view of the above-described circumstances, and an object thereof is to provide an HMD which causes the anisotropic optical film to diffuse/transmit light from a display monitor and to reduce the visibility of a black matrix, thereby making it possible to obtain a higher sense of immersion without feeling coloring.

Solution to Problem

The present inventors have made diligent studies with respect to the above problem, and have found that the visibility of a black matrix can be reduced by providing a specific anisotropic optical film whose linear transmittance changes depending on an incident light angle on a viewing side with respect to a color filter or an RGB light emitting layer in an OLED display panel, and have completed the present invention.

That is, the present invention (1) is a head-mounted display including an anisotropic optical film whose linear transmittance changes depending on an incident light angle on a viewing side with respect to a color filter or an RGB light emitting layer in an organic electroluminescence display panel, wherein:
  the anisotropic optical film includes at least a single-layered or multilayered anisotropic light diffusion layer; and
  the anisotropic light diffusion layer has a matrix region and a plurality of pillar regions having a refractive index different from that of the matrix region.

The present invention (2) is the head-mounted display according to the invention (1), wherein the single-layered or multilayered anisotropic light diffusion layer has a haze value of 50% to 85%.

The present invention (3) is the head-mounted display according to the invention (1) or (2), wherein: the anisotropic light diffusion layer has at least one scattering central axis; and
  an angle of the at least one scattering central axis is −15° to +15°.

The present invention (4) is the head-mounted display according to any one of the inventions (1) to (3), wherein:
  surface irregularities are formed in at least one outermost surface of the single-layered or multilayered anisotropic light diffusion layer; and
  the surface irregularities have an arithmetic average roughness Ra of 0.10 μm or less, which is measured in accordance with JIS B0601-2001.

The present invention (5) is the head-mounted display according to any one of the inventions (1) to (4), wherein: the plurality of pillar regions of the anisotropic light diffusion layer are configured to be oriented and extended from one surface of the anisotropic light diffusion layer to other surface; and a surface shape of each of the plurality of pillar regions in the one surface of the anisotropic light diffusion layer has a short diameter and a long diameter.

The present invention (6) is the head-mounted display according to the invention (5), wherein an aspect ratio which is average long diameter/average short diameter of the pillar regions in the one surface of the anisotropic light diffusion layer is less than 2.

The present invention (7) is the head-mounted display according to the invention (5), wherein an aspect ratio which is average long diameter/average short diameter of the pillar regions in the one surface of the anisotropic light diffusion layer is 2 to 20.

The present invention (8) is the head-mounted display according to any one of the inventions (1) to (7), wherein the anisotropic light diffusion layer has a thickness of 10 μm to 100 μm.

The present invention (9) is the head-mounted display according to any one of the inventions (1) to (8), wherein linear transmittance of light incident from a normal direction of the anisotropic optical film is 5% to 40%.

Advantageous Effects of Invention

The present invention can provide a head-mounted display which reduces the visibility of a black matrix, thereby having a higher sense of immersion without feeling coloring.

BRIEF DESCRIPTION OF DRAWINGS

FIG. 2 is a cross-sectional view showing a structural example of a display unit of an HMD according to the present invention.

FIG. 4 is a cross-sectional view of an anisotropic light diffusion layer according to the present invention in a plane direction.

FIG. 9 is a schematic diagram showing a method for producing an anisotropic light diffusion layer according to the present invention, including an optional step 1-3.

DESCRIPTION OF EMBODIMENTS

1. Definition of Main Terms

Figure 1:
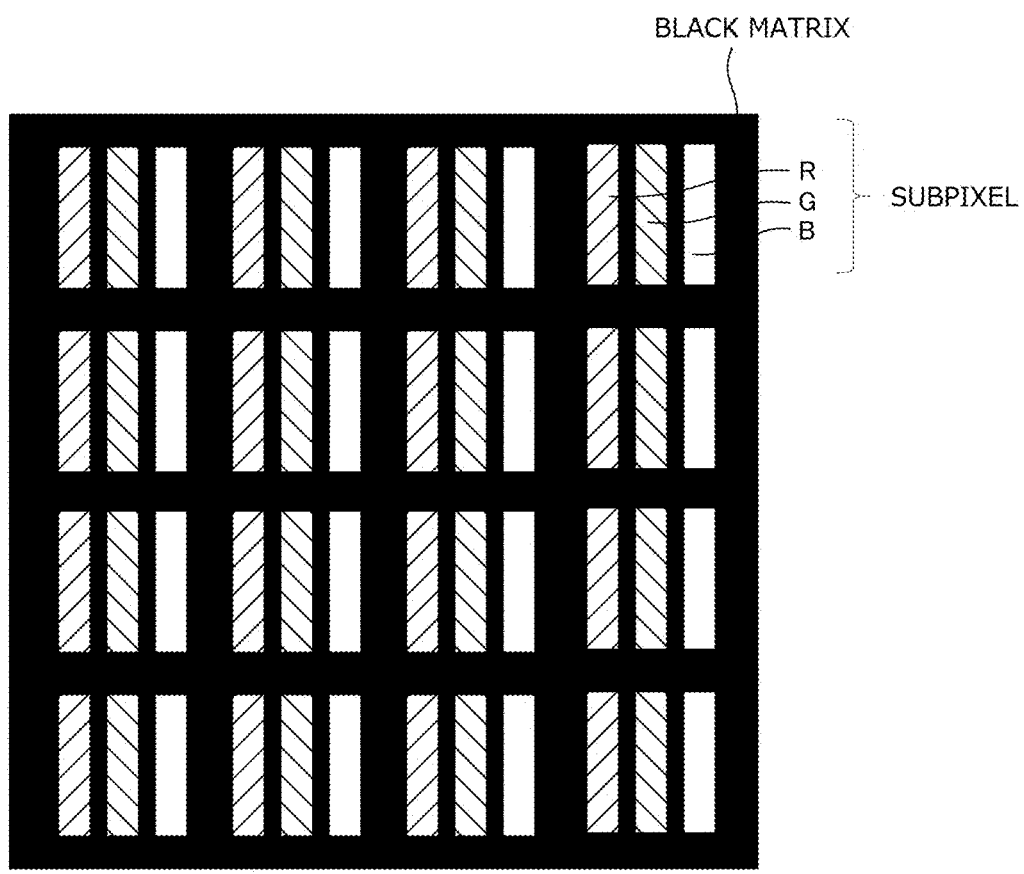
FIG. 1 is a schematic view of a color filter showing an example of a black matrix according to the present invention.

"Linear transmittance" generally relates to the linear transmitting property of light incident on an anisotropic optical film or an anisotropic light diffusion layer, and is a ratio of the amount of transmitted light in a linear direction which is the same as the incident direction and the amount of incident light when the light is incident from a certain incident light angle, which is represented by the following formula.

Linear transmittance (%)=(amount of linearly transmitted light/amount of incident light)×100

A "scattering central axis" means a direction in which the linear transmitting property coincides with the incident light angle having substantially symmetry with respect to the incident light angle when the incident light angle on the anisotropic optical film or the anisotropic light diffusion layer is changed. The "having substantially symmetry" is that when the scattering central axis has an inclination with respect to the normal direction of the film, optical characteristics (an optical profile described below) do not have symmetry strictly. The scattering central axis can be confirmed by observing the inclination of the cross section of the anisotropic optical film with an optical microscope and observing the projected shape of light through the anisotropic optical film while changing the incident light angle.

A "scattering central axis angle" is the inclination of the scattering central axis with respect to the normal direction of the surface of the anisotropic optical film or anisotropic light diffusion layer, and is an angle when the normal direction of the surface of the anisotropic optical film or anisotropic light diffusion layer is 0°.

Herein, both "scattering" and "diffusion" are used without distinction, and both have the same meaning. Furthermore, the meaning of "photopolymerization" and "photocuring" is that a photopolymerizable compound undergoes a polymerization reaction by light, and both are used synonymously.

Herein, when "normal" is simply described without any notice, it means the normal of the surface of the anisotropic optical film or the surface of the anisotropic light diffusion layer.

Herein, when "surface shape of pillar region" or "surface shape" is simply described without any notice, it means the surface shape of the surface of the anisotropic light diffusion layer of the pillar region.

1-1. Head-Mounted Display (HMD)

The HMD is a display device which is worn on the head, and is one of wearable devices such as a hat-type device and an eyeglass-type device. The HMD according to the present invention is not particularly limited as long as an OLED display panel is used as a display unit, and the HMD includes a color filter or an RGB light emitting layer on the viewing side of the OLED display panel. That is, examples thereof include a hat type or eyeglass-type HMD, an HMD using a wearing method in which the HMD is worn on both eyes or a single eye, an HMD uses a display method such as a "non-transmissive" type HMD which completely covers the eyes so that the outside cannot be visually recognized and a "transmissive" type HMD which uses a half mirror or the like to see the external appearance, and an HMD which uses a 3D type or 2D type image method.

1-2. Configuration of HMD

An example of the structure of a display unit of the HMD according to the present invention will be described with reference to FIG. 2. An OLED panel including an anisotropic optical film 130 according to the present invention is not particularly limited as long as it includes a color filter or an RGB light emitting layer, and may be any known one. FIG. 2 shows the cross-sectional structure of the OLED panel. An OLED panel 100 of FIG. 2(a) includes an anisotropic optical film 130, an organic EL layer 110 including a cathode, a white light emitting layer, an anode and a color filter, or a cathode, an RGB light emitting layer and an anode, and a glass substrate 120. The constituent elements except the anisotropic optical film 130 are referred to as an organic electroluminescence (OLED) display panel.

In the display unit of the HMD according to the present invention, the anisotropic optical film 130 is provided on the viewing side as shown in FIG. 2 (specifically, in the schematic view of FIG. 2, the viewing side with respect to the glass substrate 120). The installation position of the anisotropic optical film 130 is not particularly limited as long as the anisotropic optical film is provided on a viewing side with respect to the color filter or the RGB light emitting layer, that is, at a position closer to the eyes.

The anisotropic optical film according to the present invention may be directly or indirectly laminated on the OLED display panel, or may be provided separately from a display device {FIG. 2(b)}. It is sufficient that light emitted from the OLED display panel can be visually recognized by user's eyes through the anisotropic optical film.

The HMD according to the present invention may further include a mirror which changes the direction of light and a lens which increases the amount of light and magnifies an image.

2. Anisotropic Optical Film

Figure 3:
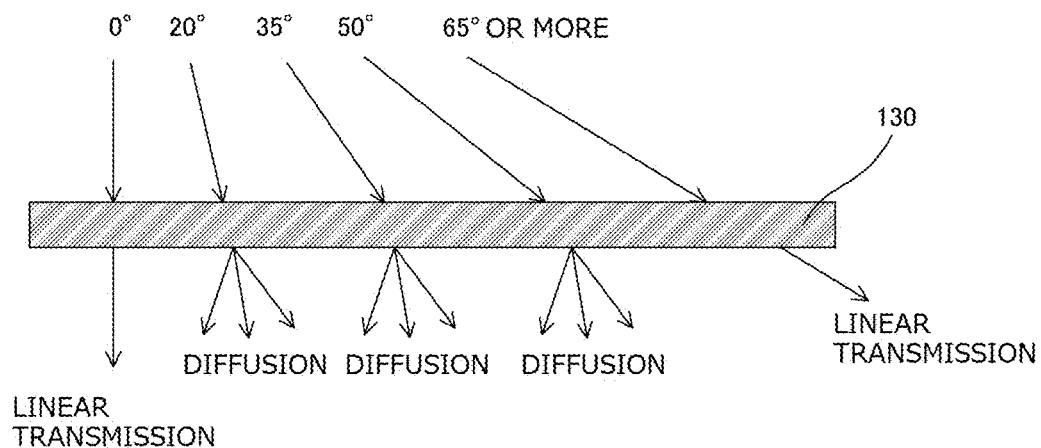
FIG. 3 is an illustration diagram showing the incident angle dependency of an anisotropic optical film according to the present invention.

In the anisotropic optical film according to the present invention, linear transmittance changes depending on the incident angle of incident light. That is, incident light in a predetermined angle range is transmitted while maintaining linearity, and incident light in the other angle range exhibits diffusibility (FIG. 3). FIG. 3 shows that, when the incident angle is 20° to 50°, the incident light exhibits diffusibility, and when the incident angle is the other angle, the incident light exhibits a linear transmitting property without exhibiting diffusibility. That is, when the incident angle is 0° smaller than 20° and 65° larger than 50°, the incident light exhibits a linear transmitting property without exhibiting diffusibility.

2-1. Structure of Anisotropic Optical Film

The anisotropic optical film according to the present invention includes at least a single-layered or multilayered anisotropic light diffusion layer. The anisotropic light diffusion layer included in the anisotropic optical film may include a plurality of anisotropic light diffusion layers having different optical properties such as a linear transmitting property, a haze value, and a scattering central axis.

Here, the multilayered anisotropic light diffusion layer is obtained by laminating a plurality of single-layered anisotropic light diffusion layers directly or with a pressure-sensitive adhesive layer interposed therebetween. A pressure-sensitive adhesive used in the pressure-sensitive adhesive layer is not particularly limited as long as it has transparency, but it is preferable to use a pressure-sensitive adhesive having pressure-sensitive adhesiveness at room temperature. Examples of such a pressure-sensitive adhesive include resins such as a polyester-based resin, an epoxy-based resin, a polyurethane-based resin, a silicone-based resin, and an acrylic resin. In particular, the acrylic resin has high optical transparency, and is relatively inexpensive, which is preferable.

Meanwhile, a composition layer containing a photopolymerizable compound is cured to form a single-layered anisotropic light diffusion layer, and a composition containing a photopolymerizable compound is then directly applied on the single-layered anisotropic light diffusion layer to produce a sheet, followed by curing, whereby the anisotropic light diffusion layer can be directly laminated on the anisotropic light diffusion layer.

Furthermore, the anisotropic optical film can be obtained by laminating a plurality of layers other than the anisotropic light diffusion layer.

Examples of the anisotropic optical film obtained by laminating the plurality of layers include an anisotropic optical film on which a layer having another function is laminated. The anisotropic optical film according to the present invention may be used in a state where the anisotropic optical film is laminated on a transparent substrate such as a glass substrate.

The anisotropic optical film of the present invention is preferably a single-layered anisotropic light diffusion layer from the viewpoint of ease of production and production cost.

The thickness of the anisotropic optical film is preferably 10 μm to 500 μm, and more preferably 50 μm to 150 μm, in consideration of use and productivity.

3. Anisotropic Light Diffusion Layer

3-1. Structure of Anisotropic Light Diffusion Layer

The anisotropic light diffusion layer according to the present invention has a matrix region and a plurality of pillar regions having a refractive index different from that of the matrix region, and has light diffusibility in which linear transmittance changes depending on an incident light angle.

The anisotropic light diffusion layer is usually composed of a cured product of a composition containing a photopolymerizable compound. Therefore, the matrix region and the pillar region have the same composition, and are formed by phase separation.

Here, the different refractive index may mean a difference in the refractive index between the matrix region and the pillar region, which causes the reflection of at least a part of light incident on the anisotropic light diffusion layer at an interface between the matrix region and the pillar region, and is not particularly limited. For example, the difference in refractive index may be 0.001 or more.

The thickness of the anisotropic light diffusion layer according to the present invention (the length in the same direction as the thickness of the anisotropic optical film) is not particularly limited. For example, the thickness of the anisotropic light diffusion layer is preferably 1 μm to 200 μm, and more preferably 10 μm to 100 μm. When the thickness exceeds 200 μm, not only the material cost is increased but also the cost for UV irradiation is increased, so that not only the production cost is increased but also image blurring and contrast reduction due to an increase in diffusibility in the thickness direction of the anisotropic light diffusion layer are apt to occur. When the thickness is less than 1 μm, it may be difficult to provide sufficient diffusibility and light condensing property.

3-2. Pillar Regions

The plurality of pillar regions included in the anisotropic light diffusion layer according to the present invention are usually oriented and extended from one surface of the anisotropic light diffusion layer to the other surface.

The surface shape of each of the plurality of pillar regions in the surface of the anisotropic light diffusion layer of the plurality of pillar regions included in the anisotropic light diffusion layer according to the present invention may be a shape having a short diameter and a long diameter.

The cross-sectional shape is not particularly limited, and may be, for example, a circular shape, an elliptical shape, or a polygonal shape. In the case of the circular shape, the short diameter and the long diameter are equal to each other. In the case of the elliptical shape, the short diameter is a length of a short axis, and the long diameter is a length of a long axis. In the case of the polygonal shape, the shortest length of the polygonal shape may be the short diameter, and the longest length thereof may be the long diameter. FIG. 4 shows the pillar regions viewed from the surface direction of the anisotropic light diffusion layer. In FIG. 4, LA represents the long diameter, and SA represents the short diameter.

The short diameter and long diameter according to the present invention can be obtained by observing the surface of the anisotropic light diffusion layer with an optical microscope, measuring a short diameter and long diameter of each of 20 pillar regions optionally selected, and taking an average value of thereof.

The average value of the short diameters of the pillar regions (average short diameter) is preferably 0.5 μm or more, more preferably 1.0 μm or more, and still more preferably 1.5 μm or more. Meanwhile, the average short diameter of the pillar regions is preferably 5.0 μm or less, more preferably 4.0 μm or less, and still more preferably 3.0 μm or less. The lower limit and upper limit of the short diameters of the pillar regions may be appropriately combined.

The average value of the long diameters (average long diameter) is preferably 0.5 μm or more, more preferably 1.0 μm or more, and still more preferably 1.5 μm or more. Meanwhile, the average long diameter of the pillar regions is preferably 100 μm or less, more preferably 50 μm or less, and still more preferably 30 μm or less. The lower limit and upper limit of the short diameters of the pillar regions may be appropriately combined.

The ratio of the average long diameter of the pillar regions according to the present invention to the average short diameter thereof (average long diameter/average short diameter), that is, the aspect ratio, is not particularly limited, but it may be, for example, 1 or more and 20 or less. FIG. 4(a) shows an anisotropic light diffusion layer having an aspect ratio of 2 to 20, and FIG. 4(b) shows an anisotropic light diffusion layer having an aspect ratio of less than 2.

The upper limit of the aspect ratio is preferably 20, more preferably 15, and still more preferably 10.

Figure 5:
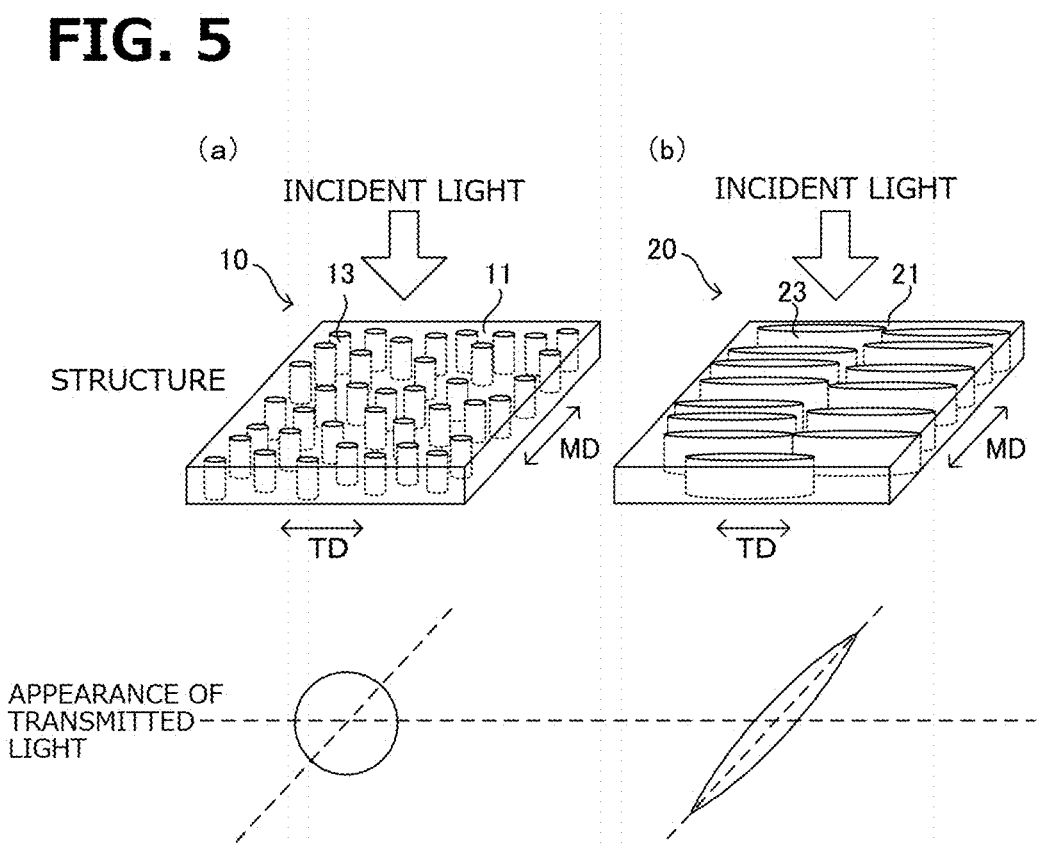
FIG. 5 is a schematic view showing an example of an anisotropic light diffusion layer according to the present invention.

When the aspect ratio is 1 or more and less than 2, and light parallel to the axial direction of the pillar regions is irradiated, the transmitted light is isotropically diffused {see FIG. 5(a)}. Meanwhile, when the aspect ratio is 2 or more and 20 or less, and light parallel to the axial direction is similarly irradiated, the light is diffused with anisotropy depending on the aspect ratio {see FIG. 5(b)}.

The anisotropic light diffusion layer according to the present invention may include a plurality of pillar regions having one aspect ratio, or may include a plurality of pillar regions having different aspect ratios.

The anisotropic light diffusion layer according to the present invention may have a scattering central axis.

The orientation direction (extension direction) P of the pillar regions may be formed so as to be parallel to the scattering central axis, and may be appropriately determined so that the anisotropic light diffusion layer has desired linear transmittance and diffusibility. In order for the scattering central axis and the orientation direction of the pillar regions to be parallel to each other, only the law of refractive index (Snell's law) has to be satisfied, and there is no need to be strictly parallel.

According to Snell's law, when light is incident on the interface of a medium having a refractive index n2 from a medium having a refractive index n1, a relationship of n1 sin θ1=n2 sin θ2 is established between an incident light angle θ1 and a refraction angle θ2. For example, assuming that n1=1 (air) and n2=1.51 (anisotropic light diffusion layer) are set, the orientation direction (refraction angle) of the pillar regions is about 19° when the incident light angle is 30°. However, even if the incident light angle is different from the refraction angle as described above, this example is included in the concept of parallelism in the present invention as long as Snell's law is satisfied.

Figure 6:
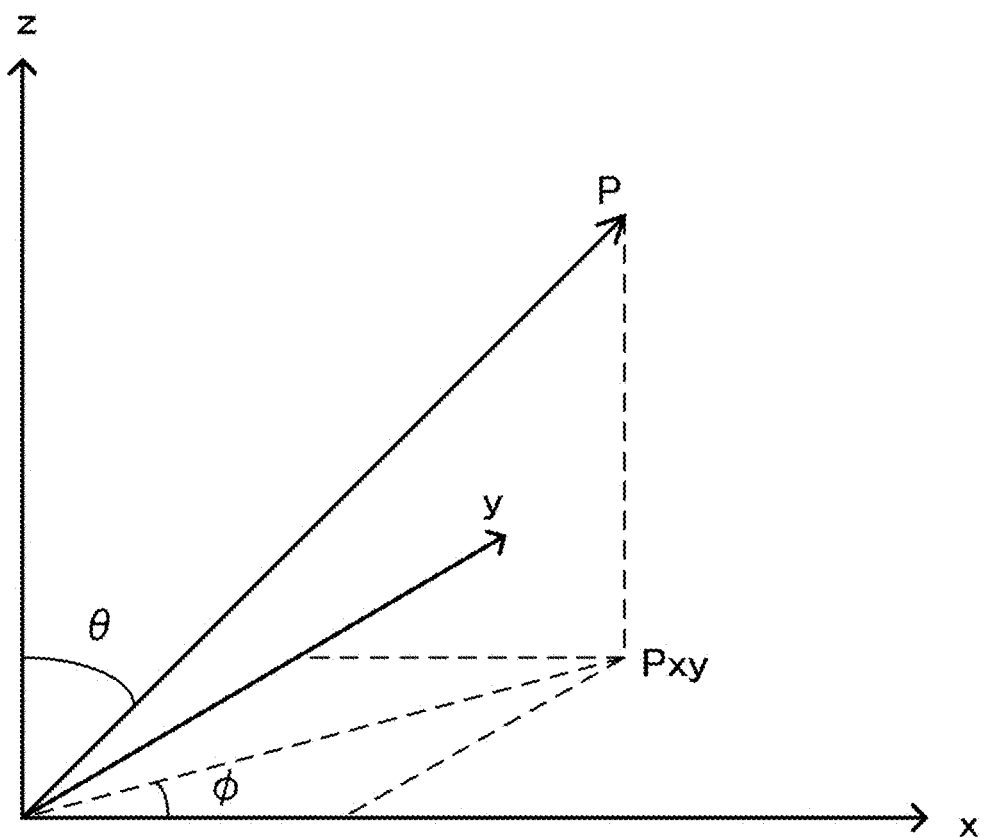
FIG. 6 is a three-dimensional polar coordinate expression for illustrating a scattering central axis in the anisotropic light diffusion layer.

Next, a scattering central axis P in the anisotropic light diffusion layer will be described with reference to FIG. 6. FIG. 6 is a three-dimensional polar coordinate expression for illustrating the scattering central axis P in the anisotropic light diffusion layer.

As described above, the scattering central axis means a direction which coincides with an incident light angle of light where the light diffusibility has a substantially symmetric property with respect to the incident light angle when the incident light angle on the anisotropic light diffusion layer is changed. The incident light angle at this time is in a substantially central portion (a central portion of the diffusion region) sandwiched between minimum values in the optical profile of the anisotropic light diffusion layer (FIG. 7) when the optical profile is measured.

According to the three-dimensional polar coordinate expression, as shown in FIG. 6, when the surface of the anisotropic light diffusion layer is regarded as an xy plane while the normal line is regarded as a z axis, the scattering central axis can be expressed by a polar angle θ and an azimuthal angle φ. That is, it can be said that Pxy in FIG. 6 is the length direction of the scattering central axis projected on the surface of the anisotropic light diffusion layer.

Here, in the present invention, a polar angle θ (−90°<θ<90°) formed by the normal line of the anisotropic light diffusion layer (z axis shown in FIG. 6) and the pillar region is defined as a scattering central axis angle. The angles of the pillar regions in the axial direction can be adjusted to a desired angle by changing the direction of light rays irradiated to a sheet-shaped composition containing a photopolymerizable compound during the production thereof.

When the anisotropic light diffusion layer according to the present invention includes a plurality of scattering central axes, the anisotropic light diffusion layer may include a plurality of pillar regions in which each of the plurality of scattering central axes and the orientation direction are parallel to each other.

The lengths of the pillar regions according to the present invention are not particularly limited. The pillar regions may penetrate from one surface of the anisotropic light diffusion layer to other surface, or may have a length which does not reach from one surface to other surface. Since the linear transmitting property of light of the anisotropic light diffusion layer can be increased, the pillar regions are preferably longer than the average long diameter.

3-3. Characteristics of Anisotropic Light Diffusion Layer

The optical characteristics of the anisotropic light diffusion layer in the present invention (linear transmittance and a haze value and the like) can be adjusted by the combinations of one or more scattering central axis angles (the angles of the pillar regions in the axial direction) and the aspect ratios of the plurality of pillar regions.

3-3-1. Optical Profile of Anisotropic Light Diffusion Layer

Figure 7:
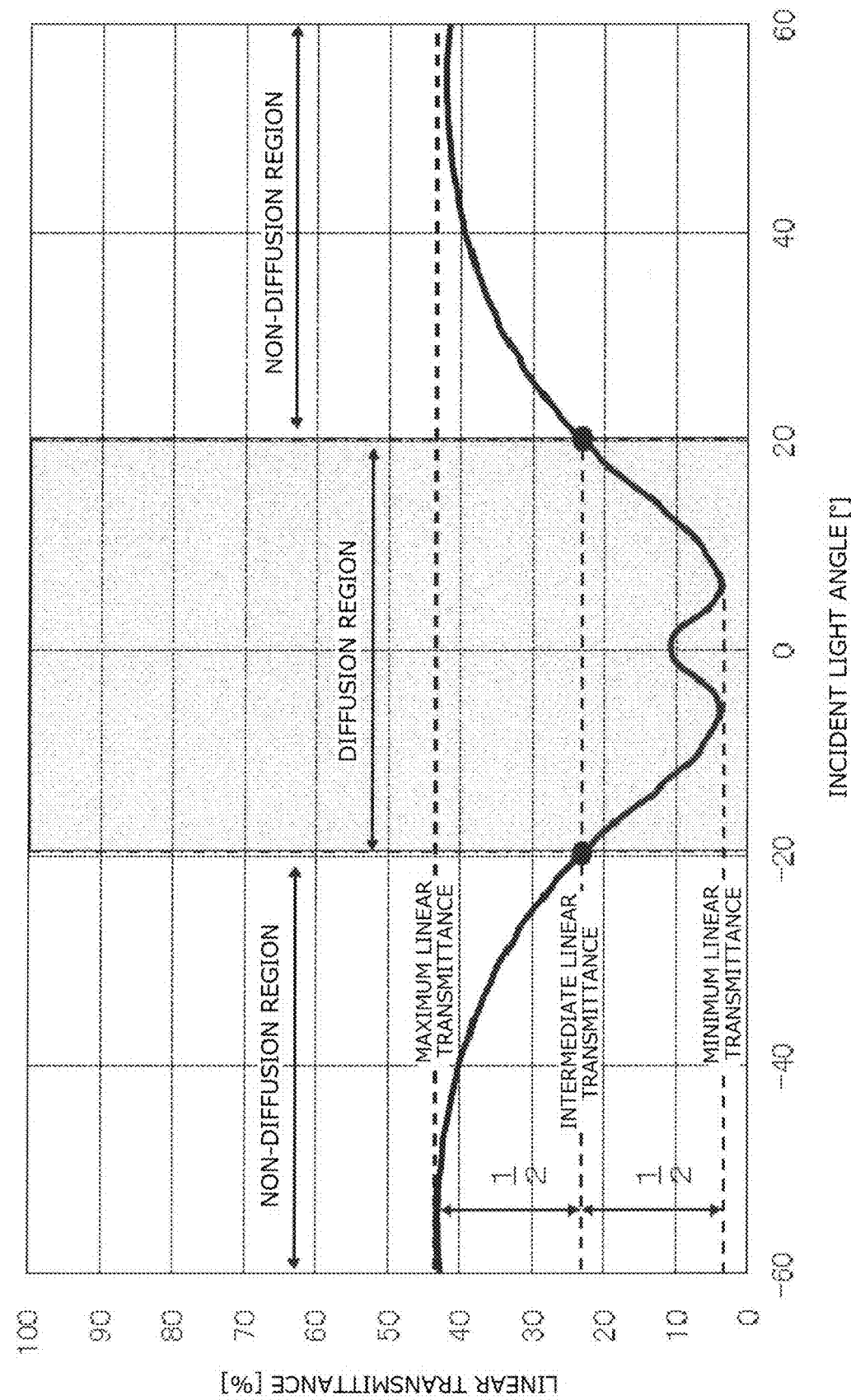
FIG. 7 is an optical profile for illustrating a diffusion region and a non-diffusion region in the anisotropic light diffusion layer.

As shown in FIG. 7, the anisotropic light diffusion layer has a light diffusible incident light angle dependency in which linear transmittance changes depending on an incident light angle. Here, as shown in FIG. 7, a curve exhibiting the light diffusible incident light angle dependency is hereinafter referred to as an "optical profile".

Figure 8:
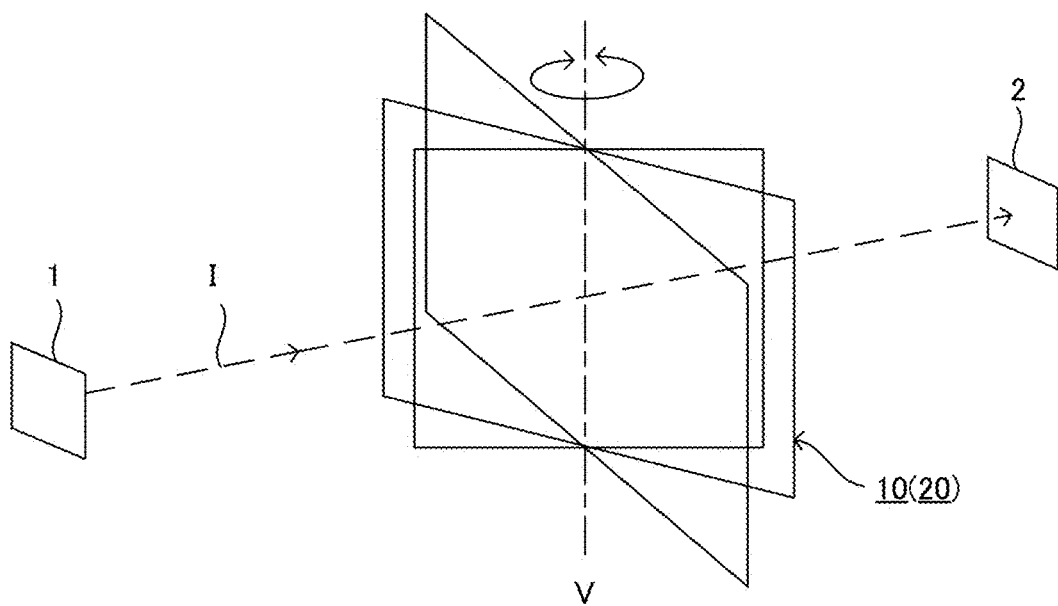
FIG. 8 is a schematic diagram showing a method for measuring the incident light angle dependency of the anisotropic light diffusion layer.

As for the optical profile, as shown in FIG. 8, the anisotropic light diffusion layer (or the anisotropic optical film) is disposed between a light source 1 and a detector 2. In the present embodiment, the incident light angle is 0° when irradiation light I from the light source 1 is incident from the normal direction of the surface of the anisotropic light diffusion layer (or the anisotropic optical film). The anisotropic light diffusion layer (or the anisotropic optical film) is disposed so as to be optionally rotatable about a straight line V, and the light source 1 and the detector 2 are fixed. That is, according to this method, the linear transmittance can be obtained by disposing a sample (the anisotropic light diffusion layer (or the anisotropic optical film)) between the light source 1 and the detector 2 and measuring the amount of linearly transmitted light which linearly transmits the sample and enters the detector 2 while the angle is changed with a straight line V on a surface of the sample as the central axis.

The optical profile does not directly represent the light diffusibility, but if it is interpreted that the linear transmittance decreases and to the contrary, the diffusive transmittance increases, it can be said that the optical profile generally shows light diffusibility.

In a normal isotropic light diffusion film, a mountain-shaped optical profile having an incident light angle peak around 0° is shown.

In the anisotropic light diffusion layer, for example, when the scattering central axis angle is 0° (FIG. 7), a valley-shaped optical profile is shown, in which linear transmittance is small at an incident light angle peak around 0° (−20° to +20°) and the linear transmittance increases as (the absolute value of) the incident light angle increases.

Thus, the anisotropic light diffusion layer has properties that the incident light is strongly diffused in the angle range of incident light close to the scattering central axis, but the diffusion is weakened and the linear transmittance is increased in the angle range of incident light beyond the angle range of incident light.

Hereinafter, as shown in FIG. 7, the angle range of two incident lights with respect to intermediate linear transmittance between the maximum linear transmittance and the minimum linear transmittance is referred to as a diffusion region (the width of this diffusion region is referred to as a "diffusion width"), and an angle range of incident light other than the angle range of two incident lights is referred to as a non-diffusion region (transmission region).

3-3-2. Linear Transmittance of Anisotropic Light Diffusion Layer

The linear transmittance of light incident from the normal direction of the surface of the anisotropic light diffusion layer of the present invention is not particularly limited. For example, when one anisotropic light diffusion layer is contained in the anisotropic optical film, the linear transmittance is preferably 5% to 40%, and more preferably 10% to 30%. This range makes it possible to enhance an effect of reducing the visibility of a BM. The linear transmittance can be obtained by measuring the amount of linearly transmitted light in the same manner as the measurement of the optical profile.

3-3-3. Haze Value of Anisotropic Light Diffusion Layer

The haze value of the anisotropic light diffusion layer of the present invention is an index exhibiting the diffusibility of the anisotropic light diffusion layer. As the haze value increases, the diffusibility of the anisotropic light diffusion layer increases. The haze value of the anisotropic light diffusion layer is not particularly limited, but it is preferably 50% to 85%, and more preferably 60% to 80%, for example. This range makes it possible to enhance an effect of reducing the visibility of a BM.

When a plurality of anisotropic light diffusion layers are included in the anisotropic optical film, the haze values of all the anisotropic light diffusion layers represent the haze value of the anisotropic light diffusion layer of the anisotropic optical film.

The method for measuring the haze value of the anisotropic light diffusion layer is not particularly limited, and can be measured by a known method. For example, the haze value can be measured in accordance with JIS K7136-1: 2000 "Method for Determining Haze of Plastic-Transparent Material".

3-3-4. Scattering Central Axis of Anisotropic Light Diffusion Layer

The anisotropic light diffusion layer according to the present invention can have at least one scattering central axis. The scattering central axis angle is not particularly limited, but it is preferably −15° to +15°, and more preferably −10° to +10°. When the scattering central axis angle is in the range of −15° to +15°, an effect of reducing the visibility of the BM is enhanced by the optical characteristics.

When a plurality of anisotropic light diffusion layers have the same scattering central axes, they serve as one scattering central axis.

3-3-5. Surface irregularities of Anisotropic Light Diffusion Layer

It is preferable that the anisotropic light diffusion layer according to the present invention has surface irregularities formed in at least one outermost surface of the anisotropic light diffusion layer. The arithmetic average roughness Ra of the surface of the anisotropic light diffusion layer is 0.10 μm or less. The arithmetic average roughness Ra is determined in accordance with JIS B0601-2001. This range makes it possible to enhance an effect of suppressing coloring due to pixels in the head-mounted display.

The arithmetic average roughness Ra of the surface of the anisotropic light diffusion layer can be measured by a known method, and is not particularly limited. Examples thereof include a non-contact method using a confocal laser microscope and the like, and a contact method using a surface roughness measuring instrument and the like using a probe.

4. Method for Producing Anisotropic Optical Film (Anisotropic Light Diffusion Layer)

The anisotropic optical film of the present invention can be produced by irradiating light rays such as UV to a photocurable composition layer. Hereinafter, raw materials of the anisotropic light diffusion layer will be first described, and a process of producing an anisotropic optical film will be then described. Hereinafter, the production of an anisotropic optical film including one anisotropic light diffusion layer, which is a suitable example, will be mainly described, and other aspects will be supplemented as necessary.

4-1. Raw Materials of Anisotropic Light Diffusion Layer

The raw materials of the anisotropic light diffusion layer will be described in the order of (1) photopolymerizable compound, (2) photoinitiator, (3) blending amount, and other optional components.

4-1-1. Photopolymerizable Compound

The photopolymerizable compound which is a material for forming the anisotropic light diffusion layer according to the present invention is composed of a photopolymerizable compound selected from macromonomers, polymers, oligomers, and monomers having a radically polymerizable or cationically polymerizable functional group and a photoinitiator, and is a material which is polymerized and cured by irradiating ultraviolet light rays and/or visible light rays. Here, even if the material forming the anisotropic light diffusion layer contained in the anisotropic optical film is one type, the difference in refractive index occurs due to the difference in density. Since the curing rate is high in a portion where the UV irradiation intensity is high, the polymerized/cured material moves around the cured region, resulting in the formation of a region where the refractive index is high and a region where the refractive index is low. In addition, (meth)acrylate may be either acrylate or methacrylate.

The radically polymerizable compound mainly contains one or more unsaturated double bonds in its molecule, and specific examples thereof include acrylic oligomers called by the names of epoxy acrylate, urethane acrylate, polyester acrylate, polyether acrylate, polybutadiene acrylate, and silicone acrylate and the like, and acrylate monomers such as 2-ethylhexyl acrylate, isoamyl acrylate, butoxyethyl acrylate, ethoxydiethylene glycol acrylate, phenoxyethyl acrylate, tetrahydrofurfuryl acrylate, isonorbornyl acrylate, 2-hydroxyethyl acrylate, 2-hydroxypropyl acrylate, 2-acryloyloxy phthalic acid, dicyclopentenyl acrylate, triethylene glycol diacrylate, neopentyl glycol diacrylate, 1,6-hexanediol diacrylate, EO adduct of bisphenol A diacrylate, trimethylolpropane triacrylate, EO modified trimethylolpropane triacrylate, pentaerythritol triacrylate, pentaerythritol tetraacrylate, ditrimethylolpropane tetraacrylate, and dipentaerythritol hexaacrylate. These compounds may be used alone or in combination of two or more. Although methacrylates can also be used in the same manner, acrylates generally have a higher photopolymerization rate than that of methacrylates, which are preferable.

As the cationically polymerizable compound, compounds having one or more of an epoxy group, a vinyl ether group and an oxetane group in the molecule can be used. Examples of the compound having the epoxy group include diglycidyl ethers of bisphenols such as 2-ethylhexyl diglycol glycidyl ether, glycidyl ether of biphenyl, bisphenol A, hydrogenated bisphenol A, bisphenol F, bisphenol AD, bisphenol S, tetramethyl bisphenol A, tetramethyl bisphenol F, tetrachlorobisphenol A, and tetrabromobisphenol A, polyglycidyl ethers of novolak resins such as phenol novolak, cresol novolak, brominated phenol novolak, and ortho cresol novolak, diglycidyl ethers of alkylene glycols such as ethylene glycol, polyethylene glycol, polypropylene glycol, butanediol, 1,6-hexanediol, neopentyl glycol, trimethylolpropane, 1,4-cyclohexanedimethanol, EO adduct of bisphenol A, and PO adduct of bisphenol A, glycidyl esters such as glycidyl ester of hexahydrophthalic acid or diglycidyl ester of dimer acid.

Examples of the compound having the epoxy group further include, but are not limited to, alicyclic epoxy compounds such as 3,4-epoxycyclohexylmethyl-3',4'-epoxycyclohexanecarboxylate, 2-(3,4-epoxycyclohexyl-5,5-spiro-3,4-epoxy)cyclohexane-meta-dioxane, di(3,4-epoxycyclohexylmethyl)adipate, di(3,4-epoxy-6-methylcyclohexylmethyl)adipate, 3,4-epoxy-6-methylcyclohexyl-3',4'-epoxy-6'-methylcyclohexanecarboxylate, methylenebis(3,4-epoxycyclohexane), dicyclopentadiene diepoxide, di(3,4-epoxycyclohexylmethyl)ether of ethylene glycol, ethylenebis(3,4-epoxycyclohexanecarboxylate), lactone modified 3,4-epoxycyclohexylmethyl-3',4'-epoxycyclohexanecarboxylate, tetra(3,4-epoxycyclohexylmethyl)butane tetra carboxylate, di(3,4-epoxycyclohexylmethyl)-4,5-epoxytetrahydrophthalate.

Examples of the compound containing the vinyl ether group include, but are not limited to, diethylene glycol divinyl ether, triethylene glycol divinyl ether, butanediol divinyl ether, hexanediol divinyl ether, cyclohexane dimethanol divinyl ether, hydroxybutyl vinyl ether, ethyl vinyl ether, dodecyl vinyl ether, trimethylolpropane trivinyl ether, and propenyl ether propylene carbonate. The vinyl ether compound is generally cationically polymerizable, but can be radically polymerizable by being combined with an acrylate.

As compound having the oxetane group, 1,4-bis[(3-ethyl-3-oxetanylmethoxy)methyl]benzene and 3-ethyl-3-(hydroxymethyl)-oxetane and the like can be used.

The above cationically polymerizable compounds may be used alone or in combination of two or more. The photopolymerizable compound is not limited to the above. In order to generate a sufficient difference in refractive index, a fluorine atom (F) may be introduced into the photopolymerizable compound to decrease the refractive index, and a sulfur atom (S), a bromine atom (Br), and various metal atoms may be introduced to increase the refractive index. Furthermore, as disclosed in JP 2005-514487 W, it is also effective to add functional ultrafine particles into which a photopolymerizable functional group such as an acryl group, a methacryl group, or an epoxy group is introduced to the above-described photopolymerizable compounds, on the surface of ultrafine particles formed of a metal oxide having a high refractive index such as titanium oxide ($TiO_2$), zirconium oxide ($ZrO_2$), or tin oxide ($SnO_x$).

It is preferable to use a photopolymerizable compound having a silicone skeleton as the photopolymerizable compound according to the present invention. The photopolymerizable compound having the silicone skeleton is oriented, polymerized, and cured with its structure (mainly ether bond), and forms a low refractive index region, a high refractive index region, or both the low refractive index region and the high refractive index region. By using the photopolymerizable compound having the silicone skeleton, the pillar regions are easily inclined, whereby the light condensing property in the front direction is improved. The low refractive index region corresponds to one of the pillar region or the matrix region, and the other thereof corresponds to the high refractive index region.

In the low refractive index region, it is preferable that the amount of a silicone resin, which is a cured product of the photopolymerizable compound having the silicone skeleton, is relatively large. As a result, the scattering central axis can be further easily inclined, whereby the light condensing property in the front direction is improved. Since the silicone resin contains a large amount of silicon (Si) as compared to a compound having no silicone skeleton, the relative amount of the silicone resin can be confirmed by using an energy dispersive X-ray spectrometer (EDS) with the silicon as an index.

The photopolymerizable compound having the silicone skeleton is monomers, oligomers, prepolymers, or macromonomers having the radically polymerizable or cationically polymerizable functional group. Examples of the radically polymerizable functional group include an acryloyl group, a methacryloyl group, and an allyl group, and examples of the cationically polymerizable functional group include an epoxy group and an oxetane group. The type and number of the functional groups are not particularly limited, but since it is preferable that the more the number of functional groups, the higher the crosslink density and the more easily the difference in refractive index is generated, it is preferable to have a multifunctional acryloyl group or methacryloyl group. The compound having the silicone skeleton may be insufficient in compatibility with other compounds due to its structure, but in such a case, can be urethanized to enhance the compatibility. In the present embodiment, silicone urethane(meth)acrylate having an acryloyl group or a methacryloyl group at an end thereof is suitably used.

The weight average molecular weight (Mw) of the photopolymerizable compound having the silicone skeleton is preferably in the range of 500 to 50,000. More preferably, the weight average molecular weight (Mw) of the photopolymerizable compound having the silicone skeleton is in the range of 2,000 to 20,000. When the weight average molecular weight is in the above range, a sufficient photocuring reaction occurs, and the silicone resin present in each of the anisotropic light diffusion layers of the anisotropic optical film 100 is easily oriented. With the orientation of the silicone resin, the scattering central axis is easily inclined.

As the silicone skeleton, for example, one represented by the following general formula (1) can be used. In the general formula (1), R1, R2, R3, R4, R5, and R6 each independently have functional groups such as a methyl group, an alkyl group, a fluoroalkyl group, a phenyl group, an epoxy group, an amino group, a carboxyl group, a polyether group, an acryloyl group, and a methacryloyl group. In the general formula (1), n is preferably an integer of 1 to 500.
[Chemical Formula 1]

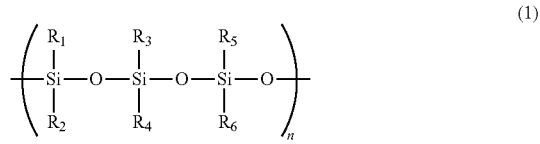

If the compound having no silicone skeleton is blended with the photopolymerizable compound having the silicone skeleton to form the anisotropic light diffusion layer, it is preferable that the low refractive index region and the high refractive index region are easily separated and formed and the anisotropic degree is strong. As the compound having no silicone skeleton, a thermoplastic resin and a thermosetting resin other than a photopolymerizable compound can be used, and these can also be used in combination. As the photopolymerizable compound, polymers, oligomers, and monomers having the radically polymerizable or cationically polymerizable functional group can be used (however, those having no silicone skeleton). Examples of the thermoplastic resin include polyester, polyether, polyurethane, polyamide, polystyrene, polycarbonate, polyacetal, polyvinyl acetate, acrylic resin, and copolymers or modified products thereof. In the case of using the thermoplastic resin, the thermoplastic resin is dissolved using a solvent and the photopolymerizable compound having the silicone skeleton is cured with ultraviolet light after application and drying, thereby forming the anisotropic light diffusion layer. Examples of the thermosetting resin include an epoxy resin, a phenol resin, a melamine resin, a urea resin, unsaturated polyester, and copolymers or modified products thereof. In the case of using the thermosetting resin, the photopolymerizable compound having the silicone skeleton is cured with ultraviolet light and is then appropriately heated to cure the thermosetting resin, thereby forming the anisotropic light diffusion layer. As the compound having no silicone skeleton, the photopolymerizable compound is most preferable, and since the low refractive index region and the high refractive index region are easily separated, the drying process in which the solvent is not necessary in the case of using the thermoplastic resin is not necessary, and the thermosetting process like the thermosetting resin is not necessary and the like, productivity is excellent.

4-1-2. Photoinitiator

Examples of the photoinitiator capable of polymerizing the radically polymerizable compound include benzophenone, benzyl, Michler's ketone, 2-chlorothioxanthone, 2,4-diethylthioxanthone, benzoin ethyl ether, benzoin isopropyl ether, benzoin isobutyl ether, 2,2-diethoxyacetophenone, benzyl dimethyl ketal, 2,2-dimethoxy-1,2-diphenylethan-1-one, 2-hydroxy-2-methyl-1-phenylpropan-1-one, 1-hydroxycyclohexyl phenyl ketone, 2-methyl-1-[4-(methylthio) phenyl]-2-morpholinopropanone-1, 1-[4-(2-hydroxyethoxy)-phenyl]-2-hydroxy-2-methyl-1-propane-1-one, bis(cyclopentadienyl)-bis[2,6-difluoro-3-(pyr-1-yl) phenyl]titanium, and 2-benzyl-2-dimethylamino-1-(4-morpholinophenyl)-butanone-1,2,4,6-trimethylbenzoyl diphenyl phosphine oxide. These compounds may be used alone or in combination of two or more.

The photoinitiator of the cationically polymerizable compound is a compound capable of generating an acid upon irradiation with light and polymerizing the above-described cationically polymerizable compound by the generated acid, and generally, onium salts and metallocene complexes are suitably used. As the onium salts, diazonium salts, sulfonium salts, iodonium salts, phosphonium salts, and selenium salts and the like are used, and as counter ions thereof, anions such as BF4-, PF6-, AsF6-, and SbF6- are used. Specific examples thereof include, but are not limited to, 4-chlorobenzenediazonium hexafluorophosphate, triphenylsulfonium hexafluoroantimonate, triphenylsulfonium hexafluorophosphate, (4-phenylthiophenyl)diphenylsulfonium hexafluoroantimonate, (4-phenylthiophenyl)diphenyl sulfonium hexafluorophosphate, bis[4-(diphenylsulfonio) phenyl]sulfide-bis-hexafluoroantimonate, bis[4-(diphenylsulfonio)phenyl]sulfide-bis-hexafluorophosphate, (4-methoxyphenyl)diphenyl sulfonium hexafluoroantimonate, (4-methoxyphenyl)phenyliodonium hexafluoroantimonate, bis(4-t-butylphenyl)iodonium hexafluorophosphate, benzyltriphenylphosphonium hexafluoroantimonate, triphenylselenium hexafluorophosphate, and (η5-isopropylbenzene) (η5-cyclopentadienyl)iron (II) hexafluorophosphate. These compounds may be used alone or in combination of two or more.

4-1-3. Blending Amount, Other Components

The photoinitiator according to the present invention is blended in about 0.01 to 10 parts by mass, preferably about 0.1 to 7 parts by mass, and more preferably about 0.1 to 5 parts by mass with respect to 100 parts by mass of the photopolymerizable compound. The reason is that if the amount of the photoinitiator is less than 0.01 parts by mass, the photocuring property is reduced, and if the amount of the photoinitiator exceeds 10 parts by mass, only the surface is cured and the curing property of the inside thereof is reduced, which causes harmful effects, coloring, and hindrance of the formation of pillar structures. These photoinitiators are usually used by directly dissolving powder in the photopolymerizable compound, but if the solubility is poor, the photoinitiator which is previously dissolved in a trace of solvent in a high concentration can be used. As the solvent, photopolymerizable solvents are more preferable, and specific examples thereof include propylene carbonate and γ-butyrolactone. It is also possible to add various known dyes and sensitizers in order to improve the photopolymerizability. Furthermore, the thermosetting initiator capable of curing the photopolymerizable compound by heating may be used in combination with the photoinitiator. In this case, it can be expected to further accelerate and complete the polymerization and curing of the photopolymerizable compound by the heating after the photocuring.

The anisotropic light diffusion layer can be formed by curing a composition in which the photopolymerizable compounds are used alone or in combination. The anisotropic light diffusion layer according to the present invention can also be formed by curing a mixture of the photopolymerizable compound and a polymer resin having no photocurability. Examples of the polymer resin which can be used here include an acrylic resin, a styrene resin, a styrene-acrylic copolymer, a polyurethane resin, a polyester resin, an epoxy resin, a cellulose resin, a vinyl acetate resin, a vinyl chloride-vinyl acetate copolymer, and a polyvinyl butyral resin. Although these polymer resins and the photopolymerizable compounds need to have sufficient compatibility before the photocuring, various organic solvents and plasticizers and the like can be used to secure the compatibility. In the case of using an acrylate as the photopolymerizable compound, as a polymer resin, those selected from the acrylic resin are preferable from the viewpoint of the compatibility.

The ratio of the photopolymerizable compound having the silicone skeleton and the compound having no silicone skeleton is preferably in the range of 15:85 to 85:15 by mass. More preferably, the ratio of the photopolymerizable compound having the silicone skeleton and the compound having no silicone skeleton is in the range of 30:70 to 70:30. By setting this range, phase separation between the low refractive index region and the high refractive index region is easily progressed, and the pillar regions are easily inclined. When the ratio of the photopolymerizable compound having the silicone skeleton is less than the lower limit or exceeds the upper limit, the phase separation is hardly progressed, and the pillar regions are hardly inclined. When the silicone-urethane-(meth)acrylate is used as the photopolymerizable compound having the silicone skeleton, the compatibility with the compound having no silicone skeleton is improved. As a result, the pillar regions can be inclined even if the mixing ratio of the materials is extended.

4-1-4. Solvent

Examples of the solvent used at the time of preparing the composition containing the photopolymerizable compound include ethyl acetate, butyl acetate, acetone, methyl ethyl ketone, methyl isobutyl ketone, cyclohexanone, toluene, and xylene.

4-2. Process for Producing Anisotropic Light Diffusion Layer

Next, a method (process) for producing the anisotropic light diffusion layer of the present embodiment will be described. First, a composition (hereinafter sometimes referred to as a "photocurable resin composition") containing the above-described photopolymerizable compound is applied on a suitable base such as a transparent PET film to be provided in a sheet form on the base, and is grown to provide a photocurable resin composition layer. The photocurable resin composition layer can be dried as necessary, to volatilize the solvent, and light is then irradiated to the photocurable resin composition layer, thereby forming an anisotropic light diffusion layer.

4-2-1. Production of Anisotropic Light Diffusion Layer

The step of forming the anisotropic light diffusion layer according to the present embodiment mainly includes the following steps:

(1) Step 1-1: a step of providing an uncured resin composition layer on a base;
(2) Step 1-2: a step of obtaining parallel light rays from a light source;
(3) Optional step 1-3: a step of making the parallel light rays incident on a directional diffusion element to obtain light rays having directivity; and
(4) Step 1-4: a step of irradiating the light rays to the uncured resin composition layer to cure the uncured resin composition layer.

4-2-1-1. Step 1-1: Step of Providing Uncured Resin Composition Layer on Base

As a method for providing a photocurable resin composition as an uncured resin composition layer in a sheet form on a base, a normal coating method or printing method is applied. Specifically, coatings such as air doctor coating, bar coating, blade coating, knife coating, reverse coating, transfer roll coating, gravure roll coating, kiss coating, cast coating, spray coating, slot orifice coating, calendar coating, dam coating, dip coating, and die coating, intaglio printing such as gravure printing, and printing such as stencil printing such as screen printing, and the like can be used. When the composition has a low viscosity, it is also possible to provide a dam having a constant height around the base to cast the composition into an inside surrounded by the dam.

4-2-1-2. Laminating of Mask

In the above step 1-1, in order to prevent the oxygen hindrance of the uncured resin composition layer to efficiently form the pillar regions which is a feature of the anisotropic light diffusion layer according to the present embodiment, it is also possible to laminate the mask in close contact with a light irradiation side of the uncured resin composition layer to locally change the irradiation intensity of light. The mask is preferably made of the following material: a light absorbing filler such as carbon is dispersed in a matrix, and a part of incident light is absorbed to carbon, but an opening portion can sufficiently transmit light. Such a matrix may be transparent plastics such as PET, TAC, PVAc, PVA, acryl, and polyethylene, inorganic matters such as glass and quartz, and those containing patterning for controlling the amount of transmitted ultraviolet light to a sheet including these matrixes or a pigment absorbing ultraviolet light. When such a mask is not used, it is also possible to prevent the oxygen hindrance of the uncured resin composition layer by performing light irradiation in a nitrogen atmosphere. It is effective in preventing the oxygen hindrance and promoting the formation of the pillar regions merely by laminating the normal transparent film on the uncured resin composition layer. Thus, the light irradiation through the mask or the transparent film is effective in producing the anisotropic light diffusion layer according to the present embodiment since the photopolymerization reaction depending on the irradiation intensity occurs in the composition containing the photopolymerizable compound, so that a refractive index distribution easily occurs.

4-2-1-3. Step 1-2: Step of Obtaining Parallel Light Rays from Light Source

As a light source, a short arc, ultraviolet light-generating light source is usually used, and specifically, it is possible to use a high pressure mercury lamp, a low pressure mercury lamp, a metal halide lamp, and a xenon lamp and the like. At this time, it is necessary to obtain light rays parallel to a desired scattering central axis. Such parallel light rays can be obtained by, for example, disposing a point light source and disposing an optical lens such as a Fresnel lens for irradiating parallel light rays between the point light source and the uncured resin composition layer. Furthermore, the parallel light rays can also be obtained by disposing a reflecting mirror behind the light source so that light is emitted as a point light source in a predetermined direction.

4-2-1-4. Step 1-4: Step of Irradiating Light Rays to Uncured Resin Composition Layer to Cure Uncured Resin Composition Layer (Case Where Optional Step 1-3 Is Not Performed)

The light rays irradiated to the uncured resin composition layer to cure the uncured resin composition layer need to contain a wavelength capable of curing the photopolymerizable compound, and light having a wavelength centered at 365 nm of a mercury lamp is usually used. In the case of producing the anisotropic light diffusion layer using this wavelength range, the illuminance is preferably in the range of 0.01 mW/cm$^2$ to 100 mW/cm$^2$, and more preferably 0.1 mW/cm$^2$ to 20 mW/cm$^2$. When the illuminance is less than 0.01 mW/cm$^2$, curing takes a long time, which deteriorates production efficiency. When the illuminance exceeds 100 mW/cm$^2$, the photopolymerizable compound is too fast cured, so that formation of the structure is not generated, and target optical characteristics cannot be exhibited. The light irradiation time is not particularly limited, but it is preferably 10 to 180 seconds, and more preferably 30 to 120 seconds. By irradiating the above-mentioned light rays, the anisotropic light diffusion layer of the present embodiment can be obtained.

The anisotropic light diffusion layer of the present embodiment is obtained by forming a specific internal structure in the uncured resin composition layer by irradiation of low illuminance light for a relatively long time as described above. Therefore, unreacted monomer components may be left only by the light irradiation to cause stickiness, which may cause problems in handling properties and durability. In such a case, the remaining monomers can be polymerized by additional irradiation of light having high illuminance of 1000 mW/cm$^2$ or more. At this time, the light irradiation may be from a side opposite to a side on which the mask is laminated.

Next, a producing method including an optional step 1-3 will be described. Since the steps 1-1 and 1-2 of the producing method including the optional step 1-3 are as described above, the optional step 1-3 and the subsequent steps will be described below.

4-2-1-5. Optional Step 1-3: Step of Making Parallel Light Rays Incident on Directional Diffusion Element to Obtain Light Rays Having Directivity FIG. 9 is a schematic diagram showing a method for producing an anisotropic light diffusion layer according to the present invention, including an optional step 1-3.

4-2-1-5-1. Directional Diffusion Element

Directional diffusion elements 301 and 302 used in the optional step 1-3 may be any element which gives the directivity to parallel light rays D incident from a light source 300. FIG. 9 describes that light E having directivity is made incident on an uncured resin composition layer 303 in such a manner that the light E is largely diffused in an X direction and hardly diffused in a Y direction. In order to obtain the light having directivity in this way, for example, a method can be adopted, in which a needle-like filler having a high aspect ratio is included in the directional diffusion elements 301 and 302, and the needle-like filler is oriented to extend its long axis in the Y direction. The directional diffusion elements 301 and 302 can use various methods in addition to the method using the needle-like filler.

Here, the aspect ratio of the light E having directivity is preferably 2 to 20. The pillar regions having an aspect ratio substantially corresponding to the aspect ratio are formed. The upper limit of the aspect ratio is more preferably 10 or less, and still more preferably 5 or less. When the aspect ratio exceeds 20, interference bow and glare may occur.

In the optional step 1-3, the sizes of the formed pillar regions (aspect ratio, short diameter: SA, long diameter: LA, and the like) can be appropriately determined by adjusting the spread of the light E having directivity. For example, the anisotropic light diffusion layer of the present embodiment can be obtained in any of FIGS. 9(a) and 9(b). The difference between FIGS. 9(a) and 9(b) is that the spread of the light E having directivity is large in FIG. 9(a) but small in FIG. 9(b). The sizes of the pillar regions vary depending on the size of the spread of the light E having directivity.

The spread of the light E having directivity mainly depends on the types of the directional diffusion elements 301 and 302 and the distance from the uncured resin composition layer 303. As the distance decreases, the sizes of the pillar regions decrease, and as the length increases, the sizes of the pillar regions increase. Therefore, the sizes of the pillar regions can be adjusted by adjusting the distance.

4-2-1-6. Step 1-4: Irradiating Light Rays to Uncured Resin Composition Layer to Cure Uncured Resin Composition Layer (Case Where Optional Step 1-3 Is Performed)

The light rays for irradiating the uncured resin composition layer through the directional diffusion element to cure the uncured resin composition layer are required to contain a wavelength capable of curing the photopolymerizable compound. Usually, light having a wavelength centered on 365 nm of a mercury lamp is used. In the case of producing the anisotropic light diffusion layer using this wavelength range, the illuminance is preferably in the range of 0.01 mW/cm$^2$ to 100 mW/cm$^2$, and more preferably 0.1 mW/cm$^2$ to 20 mW/cm$^2$. When the illuminance is less than 0.01 mW/cm$^2$, curing takes a long time, which deteriorates production efficiency. When the illuminance exceeds 100 mW/cm$^2$, the photopolymerizable compound is too fast cured, so that formation of the structure is not generated, and target optical characteristics cannot be exhibited. The light irradiation time is not particularly limited, but it is preferably 10 to 180 seconds, and more preferably 30 to 120 seconds. By irradiating the above-mentioned light rays, the anisotropic light diffusion layer of the present embodiment can be obtained.

The anisotropic light diffusion layer of the present embodiment is obtained by forming a specific internal structure in the uncured resin composition layer by irradiation of low illuminance light for a relatively long time as described above even when the optional step 1-3 is performed. Therefore, unreacted monomer components may be left only by the light irradiation to cause stickiness, which may cause problems in handling properties and durability. In such a case, the remaining monomers can be polymerized by additional irradiation of light having high illuminance of 1000 mW/cm$^2$ or more. At this time, the light irradiation may be from a side opposite to a side on which the mask is laminated.

5. Uses of Anisotropic Optical Film According to Present Invention

The anisotropic optical film according to the present invention can be suitably used as the diffusion film for the head-mounted display using the OLED display panel.

For example, when the anisotropic optical film according to the present invention is used, the anisotropic optical film may be disposed on the viewing side (emitted light side) with respect to the color filter or the RGB light emitting layer of the OLED display panel.

EXAMPLES

6. Examples

Next, the present invention will be more specifically described with reference to Examples and Comparative Examples, but the present invention is not limited by these examples.

6-1. Production of Anisotropic Optical Film

An anisotropic optical film having a single-layered or multilayered anisotropic light diffusion layer of the present invention was produced according to the following method.

6-1-1. Production of Anisotropic Optical Films 1 to 8

Anisotropic optical films used in Examples were produced by the following method.

A partition wall having a height of 50 µm was formed from a curable resin on the entire periphery of a release PET film 1 having a thickness of 100 µm using a dispenser. The following ultraviolet curable resin composition was dropped therein. The surface of the dropped liquid film was covered with any of release PET films 2 (arithmetic average roughness Ra: 0.02 µm), 3 (arithmetic average roughness Ra: 0.05 µm) or 4 (arithmetic average roughness Ra: 0.08 µm) which had a higher peeling force than that of the PET film 1, and different arithmetic average roughnesses Ra determined in accordance with JIS B0601-2001. Thus, a liquid film of an uncured resin composition layer having a thickness of 50 µm was produced.

Specifically, the release PET film 2 was used for producing anisotropic optical films 1 to 3, 5, and 6; the release PET film 3 was used for producing an anisotropic optical film 7; and the release PET film 4 was used for producing an anisotropic optical film 4.

All the compositions of the uncured resin composition layers used in Examples were the same.

6-1-1-1. Ultraviolet Curable Resin Composition

Silicone urethane acrylate (refractive index: 1.460, weight average molecular weight: 5890) 20 parts by mass
(Trade name: 00-225/TM18, manufactured by RAHN AG)
Neopentyl glycol diacrylate (refractive index: 1.450) 30 parts by mass
(Trade name: Ebecryl 145, manufactured by Daicel-Cytec Co., Ltd.)
EO adduct diacrylate of bisphenol A (refractive index: 1.536) 15 parts by mass
(Trade name: Ebecryl 150, manufactured by Daicel-Cytec Co., Ltd.)
Phenoxyethyl acrylate (refractive index: 1.518) 40 parts by mass
(Trade name: Light Acrylate PO-A, manufactured by Kyoeisha Chemical Co., Ltd.)
2,2-dimethoxy-1,2-diphenylethan-1-one, 4 parts by mass
(Trade name: Irgacure 651, manufactured by BASF SE)

Subsequently, the liquid film of the uncured resin composition layer was heated, and parallel ultraviolet light having irradiation intensity of 5 mW/cm$^2$ was irradiated directly or through a directional diffusion element from an epi-illumination unit of a UV spot light source (Trade name: L2859-01, manufactured by Hamamatsu Photonics K.K.) for 1 minute. As a result, as shown in FIG. 4, anisotropic optical films 1 to 7 were produced, which had a PET film on each of both surfaces of a single-layered anisotropic light diffusion layer having a plurality of pillar regions.

Specifically, in the production of the anisotropic optical films 1 to 5, a directional diffusion element was not used, and in the production of the anisotropic optical films 6 and 7, a directional diffusion element which can change the aspect ratio of parallel light rays was used.

In addition, in the production of the anisotropic optical films 1 to 4, 6 and 7, parallel light rays were irradiated from the angle of a normal direction (angle: 0°) to the plane surface of the liquid film of the uncured resin composition layer. In the production of the anisotropic optical film 5, parallel light rays were irradiated at an angle of 15° with respect to the normal direction.

An anisotropic optical film 8 was produced by producing the two anisotropic optical films 7 produced above, thereafter peeling off the release PET film 3 of each of the anisotropic optical films 7, and laminating the peeled-off surface of each of the anisotropic optical films 7 with a transparent pressure-sensitive adhesive layer having a thickness of 10 µm being interposed therebetween in a state where one anisotropic optical film 7 was rotated by 90° with respect to the other anisotropic optical film 7 so that directions of long diameters of a plurality of pillar regions in one anisotropic optical film 7 and directions of long diameters of a plurality of pillar regions in the other anisotropic optical film 7 are in a mutually perpendicular relationship.

The characteristics of the produced anisotropic optical films 1 to 8 are shown in Table 1 below.

6-2. Preparation of Comparative Optical Film 1

An isotropic diffusion pressure-sensitive adhesive layer, which was a comparative optical film 1, was produced as follows.

To 100 parts by mass of the following acrylic pressure-sensitive adhesive composition having a refractive index of 1.47, 20 parts by mass of silicone resin fine particles (Trade name: Tospearl 145, manufactured by Momentive Performance Materials, Inc.) as fine particles having a different refractive index from that of the pressure-sensitive adhesive composition were added, followed by stirring with an agitator for 30 minutes to disperse the fine particles, thereby obtaining a coating liquid. The coating liquid was applied on the release PET film 5 having a thickness of 38 µm and an arithmetic average roughness Ra of 0.15 µm measured in accordance with JIS B 0601-2001 using a comma coater so that the film thickness after solvent drying was 25 and dried to produce an isotropic diffusion pressure-sensitive adhesive layer with PET. Furthermore, a release PET film having a higher peeling force than that of the release PET film 5 and a thickness of 38 µm (Trade name: 3801, manufactured by LINTEC Corporation) was laminated on the surface of the diffusion pressure-sensitive adhesive layer, to produce a comparative optical film 1 having a PET film on each of both surfaces, as an isotropic diffusion pressure-sensitive adhesive layer with PET on each of both surfaces.

The characteristics of the produced comparative optical film 1 were shown in Table 1 below.

6-2-1. Acrylic Pressure-Sensitive Adhesive Composition

Acrylic pressure-sensitive adhesive (total solid concentration: 18.8%, solvent: ethyl acetate, methyl ethyl ketone) 100 parts by mass
(Trade name: SK Dyne TM206, manufactured by Soken Chemical & Engineering Co., Ltd.)
Isocyanate curing agent: 0.5 parts by mass
(Trade name: L-45, manufactured by Soken Chemical & Engineering Co., Ltd.)
Epoxy curing agent: 0.2 parts by mass
(Trade name: E-SXM, manufactured by Soken Chemical & Engineering Co., Ltd.)

6-3. Production of Comparative Optical Film 2

As a comparative optical film 2, a commercially available isotropic light diffusion film having a thickness of 120 μm (Trade name: D120P, manufactured by Tsujiden Co., Ltd.) was used.

The characteristics of the comparative optical film 2 used were shown in Table 1 below.

characteristics in the optical profile were substantially symmetrical were obtained. The results were shown in Table 1.

6-5-3. Measurement of Aspect Ratios of Pillar Regions (Observation of Surface of Anisotropic Light Diffusion Layer)

The surfaces of the anisotropic optical films 1 to 8 shown in Table 1 (ultraviolet irradiation side during production)

TABLE 1

| TYPE OF OPTICAL FILM No. | HAZE VALUE | SCATTERING CENTRAL AXIS ANGLE | LINEAR TRANSMITTANCE (NORMAL DIRECTION) | ASPECT RATIO | ARITHMETIC AVERAGE ROUGHNESS Ra | REMARKS |
|---|---|---|---|---|---|---|
| ANISOTROPIC 1 | 70% | ABOUT 0° | 25% | 1.1 | 0.02 μm | |
| ANISOTROPIC 2 | 85% | ABOUT 0° | 10% | 1.1 | 0.02 μm | |
| ANISOTROPIC 3 | 50% | ABOUT 0° | 40% | 1 | 0.02 μm | |
| ANISOTROPIC 4 | 70% | ABOUT 0° | 25% | 1.1 | 0.08 μm | |
| ANISOTROPIC 5 | 70% | ABOUT 15° | 35% | 1.1 | 0.02 μm | |
| ANISOTROPIC 6 | 70% | ABOUT 0° | 30% | 2.3 | 0.02 μm | |
| ANISOTROPIC 7 | 70% | ABOUT 0° | 30% | 10 | 0.05 μm | |
| ANISOTROPIC 8 | 80% | ABOUT 0° | 15% | 10 (0°)/ 10 (90°) | 0.05 μm | TWO ANISOTROPIC OPTICAL FILMS 7 ARE LAMINATED IN A STATE WHERE THE ANISOTROPIC OPTICAL FILMS ARE ROTATED BY 90° RELATIVE TO EACH OTHER. |
| COMPARATIVE 1 | 75% | — | 20% | — | 0.05 μm | ISOTROPIC DIFFUSION PRESSURE-SENSITIVE ADHESIVE LAYER |
| COMPARATIVE 2 | 75% | — | 20% | — | 0.20 μm | ISOTROPIC DIFFUSION FILM |

6-5. Measurement

The characteristics of the anisotropic optical films 1 to 8, and the comparative optical films 1 and 2 shown in Table 1 were measured as follows.

6-5-1. Measurement of Haze Value of Anisotropic Light Diffusion Layer

The haze value of each of the optical films shown in Table 1 was measured in accordance with JIS K7136 using a haze meter NDH-2000 manufactured by Nippon Denshoku Industries Co., Ltd. Here, as the haze value is higher, the diffusibility of the anisotropic light diffusion layer is higher.

6-5-2. Measurement of Scattering Central Axis Angle and Linear Transmittance

As shown in FIG. 8, using a goniophotometer (manufactured by GENESIA), which is capable of optionally varying the flood lighting angle of the light source and the light receiving angle of the detector, the amount of linearly transmitted light of each of the optical films shown in Table 1 was measured.

The detector was fixed to the position where straight light from the light source was received, and each of the optical films shown in Table 1 was set as a sample in a sample holder between the detector and the light source. The sample was rotated around a straight line V in FIG. 8, and the amount of linearly transmitted light corresponding to each of incident light angles to the sample was measured. The straight line V may be optional in the comparative optical films 1 and 2, but in the case of the anisotropic optical films 1 to 8 having anisotropy, the measurement was performed by rotating the sample around a CC axis shown in FIG. 4 as a central axis.

The linear transmittance was calculated from the above measurement, to obtain the optical profile of each of the optical films shown in Table 1. As shown in the optical profile, the linear transmittance of light incident from the normal direction of the film plane surface of each of the optical films shown in Table 1 and the scattering central axis angle as an incident light angle at which light diffusion were observed with an optical microscope, and the long diameter LA and short diameter SA of each of any 20 pillar regions of a plurality of pillar regions were measured. The average value of the measured long diameters LA and the average value of the measured short diameters SA were calculated, and the average long diameter LA/average short diameter SA was calculated as the aspect ratio of the pillar region.

6-5-4. Measurement of Arithmetic Average Roughness Ra

The arithmetic average roughness Ra of each of the optical films shown in Table 1 was measured in accordance with JIS B0601-2001 using Surfcoder SE1700α manufactured by Kosaka Laboratory Ltd.

6-6. Production of Head-Mounted Display

On a commercially available backlight, an OLED display panel including a color filter with a pixel pitch of 326 ppi (pixel size: 0.078 mm×0.078 mm) was disposed. On the surface of the glass substrate which is on the viewing side with respect to the color filter, each of the optical films of Table 1 produced above was laminated in a state where the release PET film of each of the optical films was peeled off. Furthermore, by disposing a lens (magnification: 10 times) on the plane surface of the optical film, head-mounted displays of Examples 1 to 8 and Comparative Examples 1 and 2 were produced. As Comparative Example 4, a head-mounted display in which an optical film was not laminated was produced. Table 2 below showed the optical films used and characteristics of the produced head-mounted displays of Examples 1 to 8 and Comparative Examples 1, 2 and 4.

6-6-1. Sensory Test

The produced head-mounted displays of Examples 1 to 8 and Comparative Examples 1, 2 and 4 were subjected to a sensory test. The results of evaluation according to the following evaluation criteria were shown in Table 2.

6-6-1-1. Evaluation Criteria of Erasing of Black Matrix

⊚: A black matrix is hardly observed.

∘: A thin black matrix is observed.

Δ: A thin black matrix is slightly observed.

6-6-1-2. Evaluation Criteria of Coloring
 ○: Coloring feeling due to pixels can be sufficiently suppressed.
 Δ: Coloring feeling due to pixels can be slightly suppressed.
 X: Coloring feeling due to pixels is apparent.
6-6-1-3. Evaluation Criteria of Blurring Feeling
 ⊚: Image display is clearly observed.
 ○: Image display is observed in a slightly blurred state.
 Δ: Image display is observed in a blurred state.
6-6-2. Measurement of Total Light Transmittance The total light transmittance of each of the produced head-mounted displays of Examples 1 to 8 and Comparative Examples 1, 2 and 4 was measured using a haze meter NDH-2000 manufactured by Nippon Denshoku Industries Co., Ltd. with the total light transmittance when each of the optical films shown in Table 1 was excluded as 100%.

The results of evaluation according to the following evaluation criteria were shown in Table 2.
6-6-2-1. Evaluation Criteria of Total Light Transmittance
 ○: 30% or more
 X: less than 30% optical films are rotated by 90° relative to each other in consideration of the directions of the long diameters of the pillar regions as described above. The black matrix could be extremely hardly observed in both the longitudinal and lateral directions.

The OLED display panel including the color filter is used in the present Examples, but it is considered that the same effect can be expected by using the OLED display panel including the RGB light emitting layer.

Meanwhile, in Comparative Examples 1, 2 and 4, any of the evaluation items shown in Table 2 was X.

The main cause of X evaluation of coloring of Comparative Example 1 is considered to be as follows: the isotropic diffusion pressure-sensitive adhesive layer is used, so that light diffusion due to the fine particles occurs, which causes interference of light, resulting in poor coloring due to pixels. In addition, the poor coloring made flickering in the screen conspicuous. Furthermore, as shown in Table 2, in Comparative Example 1, the total light transmittance was lower than that of the anisotropic optical film of the present invention, so that the decrease in brightness was large.

TABLE 2

| EXAMPLES | TYPE OF OPTICAL FILM USED NO. | ERASING OF BLACK MATRIX | COLORING | BLURRING FEELING | TOTAL LIGHT TRANSMITTANCE | REMARKS |
|---|---|---|---|---|---|---|
| EXAMPLE 1 | ANISOTROPIC 1 | ○ | ○ | ○ | ○45% | |
| EXAMPLE 2 | ANISOTROPIC 2 | ⊚ | ○ | Δ | ○40% | |
| EXAMPLE 3 | ANISOTROPIC 3 | Δ | ○ | ⊚ | ○50% | |
| EXAMPLE 4 | ANISOTROPIC 4 | ○ | ○ | ○ | ○45% | |
| EXAMPLE 5 | ANISOTROPIC 5 | ○ | ○ | ○ | ○45% | |
| EXAMPLE 6 | ANISOTROPIC 6 | ○ | ○ | ○ | ○45% | |
| EXAMPLE 7 | ANISOTROPIC 7 | Δ | ○ | ○ | ○45% | THE BLACK MATRIX CANNOT BE EXTREMELY SEEN ONLY IN ONE LONGITUDINAL OR LATERAL DIRECTION. |
| EXAMPLE 8 | ANISOTROPIC 8 | ⊚ | ○ | Δ | ○35% | THE BLACK MATRIX CANNOT BE EXTREMELY SEEN IN BOTH THE LONGITUDINAL AND LATERAL DIRECTIONS. |
| COMPARATIVE EXAMPLE 1 | COMPARATIVE 1 | Δ | x | Δ | x25% | |
| COMPARATIVE EXAMPLE 2 | COMPARATIVE 2 | ○ | x | Δ | x25% | |
| COMPARATIVE EXAMPLE 4 | NONE | x | ○ | ⊚ | ○60% | NO OPTICAL FILM. THE BLACK MATRIX IS VERY CONSPICUOUS. |

As shown in the results of Table 2, in Examples 1 to 8, the evaluations of the erasing of the black matrix were greater than or equal to Δ; all the evaluations of the coloring were also Δ; and the total light transmittances were also high, i.e., 35% or higher.

Therefore, in the head-mounted display using the anisotropic optical film of the present invention, the black matrix was hardly observed, so that not only roughness due to pixels was good, but also color feeling due to pixels was suppressed, and total light transmittance was also high. Therefore, it was possible to suppress a decrease in brightness.

In particular, Examples 1, 4, 5, and 6 had a high level of characteristics in a well-balanced manner in all the evaluation items of black matrix erasing, coloring, blurring feeling, and total light transmittance.

In Example 7, the anisotropic optical film having a high aspect ratio among Examples was used, whereby the black matrix could be extremely hardly observed only in one longitudinal or lateral direction.

Example 8 is obtained by laminating the anisotropic optical films of Example 7 in a state where the anisotropic It is considered that Comparative Example 2 is thicker than Comparative Example 1, whereby the evaluation of erasing of the black matrix is good, but the isotropic diffusion film of Comparative Example 2 has poor coloring for the same reason as that of Comparative Example 1, which makes flickering in the screen conspicuous. Furthermore, as shown in Table 2, the total light transmittance was lower than that of the anisotropic optical film of the present invention, so that the decrease in brightness was large.

No optical film was used in Comparative Example 4, so that the black matrix was very conspicuous.

As described above, the head-mounted display including the anisotropic optical film of the present invention has an effect of hardly observing the black matrix, suppresses the roughness and coloring feeling due to the pixels, has less blurring feeling, can suppress the decrease in brightness, and can obtain a higher sense of immersion.

REFERENCE SIGNS LIST

1 light source
2 detector

100 OLED panel
110 organic EL layer
120 glass substrate
130 anisotropic optical film
200 anisotropic light diffusion layer
201, 211 matrix region
202, 212 pillar region
300 light source
301, 302 directional diffusion element
303 uncured resin composition layer

The invention claimed is:

1. A head-mounted display comprising an anisotropic optical film whose linear transmittance changes depending on an incident light angle on a viewing side with respect to a color filter or an RGB light emitting layer in an organic electroluminescence display panel, wherein:
the anisotropic optical film includes at least a single-layered or multilayered anisotropic light diffusion layer;
the anisotropic light diffusion layer has a matrix region and a plurality of pillar regions having a refractive index different from that of the matrix region;
surface irregularities are formed in at least one outermost surface of the single-layered or multilayered anisotropic light diffusion layer; and
the surface irregularities have an arithmetic average roughness Ra of 0.10 μm or less, which is measured in accordance with JIS B0601-2001.

2. The head-mounted display according to claim 1, wherein the single-layered or multilayered anisotropic light diffusion layer has a haze value of 50% to 85%.

3. The head-mounted display according to claim 1, wherein:
the anisotropic light diffusion layer has at least one scattering central axis; and
an angle of the at least one scattering central axis is −15° to +15°.

4. The head-mounted display according to claim 1, wherein:
the plurality of pillar regions of the anisotropic light diffusion layer are configured to be oriented and extended from one surface of the anisotropic light diffusion layer to other surface; and
a surface shape of each of the plurality of pillar regions in the one surface of the anisotropic light diffusion layer has a short diameter and a long diameter.

5. The head-mounted display according to claim 4, wherein an aspect ratio which is average long diameter/average short diameter of the pillar regions in the one surface of the anisotropic light diffusion layer is less than 2.

6. The head-mounted display according to claim 4, wherein an aspect ratio which is average long diameter/average short diameter of the pillar regions in the one surface of the anisotropic light diffusion layer is 2 to 20.

7. The head-mounted display according to claim 1, wherein the anisotropic light diffusion layer has a thickness of 10 μm to 100 μm.

8. The head-mounted display according to claim 1, wherein linear transmittance of light incident from a normal direction of the anisotropic optical film is 5% to 40%.

9. The head-mounted display according to claim 2, wherein:
the anisotropic light diffusion layer has at least one scattering central axis; and
an angle of the at least one scattering central axis is −15° to +15°.

10. The head-mounted display according to claim 2, wherein:
the plurality of pillar regions of the anisotropic light diffusion layer are configured to be oriented and extended from one surface of the anisotropic light diffusion layer to other surface; and
a surface shape of each of the plurality of pillar regions in the one surface of the anisotropic light diffusion layer has a short diameter and a long diameter.

11. The head-mounted display according to claim 3, wherein:
the plurality of pillar regions of the anisotropic light diffusion layer are configured to be oriented and extended from one surface of the anisotropic light diffusion layer to other surface; and
a surface shape of each of the plurality of pillar regions in the one surface of the anisotropic light diffusion layer has a short diameter and a long diameter.

12. The head-mounted display according to claim 9, wherein:
the plurality of pillar regions of the anisotropic light diffusion layer are configured to be oriented and extended from one surface of the anisotropic light diffusion layer to other surface; and
a surface shape of each of the plurality of pillar regions in the one surface of the anisotropic light diffusion layer has a short diameter and a long diameter.

* * * * *